(12) United States Patent
Balasinski et al.

(10) Patent No.: US 6,834,262 B1
(45) Date of Patent: Dec. 21, 2004

(54) SCHEME FOR IMPROVING THE SIMULATION ACCURACY OF INTEGRATED CIRCUIT PATTERNS BY SIMULATION OF THE MASK

(75) Inventors: Artur E. Balasinski, Cupertino, CA (US); Dianna L. Coburn, Santa Clara, CA (US); Keeho E. Kim, San Jose, CA (US); Dongsung Hong, Bloomington, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 590 days.

(21) Appl. No.: 09/608,158

(22) Filed: Jun. 30, 2000

(Under 37 CFR 1.47)

Related U.S. Application Data
(60) Provisional application No. 60/142,298, filed on Jul. 2, 1999.

(51) Int. Cl.[7] .............................................. G06F 17/50
(52) U.S. Cl. ......................................................... 703/13
(58) Field of Search ................................ 703/13, 22, 2, 703/5, 14; 716/19, 8, 21, 16, 9; 430/5, 312; 257/435; 438/14; 356/237.5

(56) References Cited

U.S. PATENT DOCUMENTS

| | | | |
|---|---|---|---|
| 3,751,647 A | | 8/1973 | Maeder et al. ............... 713/401 |
| 3,842,491 A | | 10/1974 | Depuy et al. .................. 438/14 |
| 5,432,587 A | | 7/1995 | Nozue .......................... 355/53 |
| 5,815,404 A | | 9/1998 | Goetting et al. .............. 116/16 |
| 5,866,935 A | * | 2/1999 | Sogard ........................ 257/435 |
| 6,038,020 A | * | 3/2000 | Tsukuda ................... 356/237.5 |
| 6,096,457 A | * | 8/2000 | Pierrat ............................ 430/5 |
| 6,223,139 B1 | * | 4/2001 | Wong et al. .................... 703/5 |
| 6,261,724 B1 | * | 7/2001 | Bula et al. ...................... 430/5 |
| 6,263,299 B1 | * | 7/2001 | Aleshin et al. ................. 703/5 |
| 6,301,697 B1 | * | 10/2001 | Cobb .......................... 716/19 |
| 6,383,719 B1 | * | 5/2002 | Bula et al. ................... 430/312 |
| 6,425,117 B1 | * | 7/2002 | Pasch et al. .................. 716/21 |
| 6,453,274 B2 | * | 9/2002 | Kamon .......................... 703/2 |
| 6,453,452 B1 | * | 9/2002 | Chang et al. .................. 716/8 |
| 6,470,489 B1 | * | 10/2002 | Chang et al. ................. 716/21 |
| 6,499,007 B1 | | 12/2002 | Kuroki et al. ................ 703/22 |

OTHER PUBLICATIONS

Sharan et al., "Panel: Subwavelength lithography: How will it affect your design flow?", IEEE Jun. 1999.*
Kahng et al., "Subwavelength lithography and its potential impact on design and EDA", ACM, Jun. 25, 1999.*
Axelrad, V. et al., "Efficient full–chip yield analysis methodology for OPC–corrected VLSI designs", IEEE, Mar. 2000.*
Balasinski, A et al., "A novel pproach to simulate the effect of Optical Proximity on MOSFET parametric yield", IEEE, Dec. 1999.*

* cited by examiner

*Primary Examiner*—Kevin J. Teska
*Assistant Examiner*—Kandasamy Thangavelu
(74) *Attorney, Agent, or Firm*—Evan Law Group LLC

(57) ABSTRACT

A mask simulation process is introduced into a conventional OPC procedure, prior to simulation of a photoresist pattern. Reticle simulation may be achieved using very short wavelengths of light as compared to the mask feature size. Alternatively, reticle simulation may be made through adjustments in a computer aided design process.

11 Claims, 12 Drawing Sheets

SCHEME FOR IMPROVING THE SIMULATION ACCURACY OF INTEGRATED CIRCUIT PATTERNS BY SIMULATION OF THE MASK

RELATED APPLICATIONS

This application claims priority from U.S. provisional application Ser. No. 60/142,298, filed Jul. 2, 1999.

FIELD OF THE INVENTION

The present invention relates to the field of semiconductor device manufacturing processes and, in particular, to a scheme for improving the accuracy of integrated circuit pattern simulation by first simulating a photolithographic mask of the circuit, followed by image simulation of that mask on a wafer.

BACKGROUND

Figure 1:
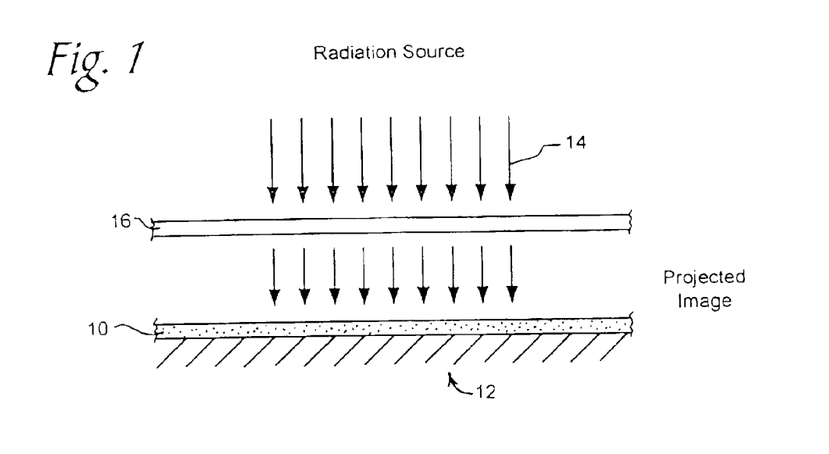
FIG. 1 illustrates a conventional scheme for printing a circuit feature on a semiconductor wafer or die through a mask or reticle.

As shown in FIG. 1, during the manufacture of integrated circuits, various circuit features are patterned in photoresist layers 10 that are disposed over a semiconductor wafer or die 12 by exposing the photoresist to radiation (e.g., various wavelengths of light) 14 through a mask or reticle 16. The mask 16 is created from an as-drawn design for the circuit features produced by a circuit designer using conventional software tools. However, the image of a photolithographic mask 16 printed on a silicon wafer 12 (i.e., on a photoresist layer 10) is usually significantly distorted with respect to the drawn design, due to light refraction effects. To compensate for these distortions, corner rounding and proximity effects of the design need to be predicted by pattern simulation in a process referred to as optical proximity correction (OPC). OPC involves the use of software simulation tools to convert the drawn design into an aerial image of light intensity contours, which correspond to the actual photoresist patterns that will be printed on the wafer. The drawn layout may then be corrected, for example by adding sublithographic features such as serifs, with subsequent iterations of the simulation (manual or automated) providing feedback to achieve a desired final shape.

In this simulation process, it is usually assumed that the photolithographic mask is an ideal reproduction of the drawn pattern. However, mask making processes have limited accuracy due to the limitations of finite e-beam spot sizes and mechanical limitations of photoresist development and etching processes. Consequently, small serifs used for correction of proximity effects may not be adequately reproduced in the masks. Disregarding such mask errors in the process of correcting the drawn circuit feature layouts may result in substantial deviations from the desired image when the image is printed on a wafer. Thus, what is needed is a process to ensure that the masks are produced as accurately as possible.

SUMMARY OF THE INVENTION

In accordance with one embodiment of the present scheme, a mask simulation process is introduced into a conventional OPC procedure, prior to simulation of a photoresist pattern. Reticle simulation may be achieved using very short wavelengths of light as compared to the mask feature size. Alternatively, reticle simulation may be made through adjustments in a computer aided design process.

BRIEF DESCRIPTION OF THE DRAWINGS

The present invention is illustrated by way of example, and not limitation, in the figures of the accompanying drawings in which like reference numerals refer to similar elements and in which.

DETAILED DESCRIPTION

A scheme for improving the accuracy of integrated circuit (IC) pattern simulation is disclosed herein. More specifically, a scheme wherein a photolithographic mask of an IC is first simulated, followed by image simulation of that mask on a wafer is described. Although in the past it has been difficult to predict the manner in which the photolithographic mask pattern might differ from an as-drawn design, a newly developed calibration process (described more fully below) has shown that, in general, the pattern is mainly subject to corner rounding effects. These effects may thus be incorporated into the pattern simulation process by (1) simulating proximity effects of the mask, and/or (2) adjusting the drawn mask pattern as part of a computer aided design (CAD) process.

In the first case, pattern simulation with OPC software tools may be used, assuming a very short wavelength of light is used to minimize refraction effects, to obtain the desired amount of corner rounding to accurately simulate proximity effects of the mask. In the second case, typical mask distortions can be identified and applied to design features such as corners and serifs. In either type of mask simulation, one should take into account the image resolution due to grid and pixel sizes. After a mask is defined using either or both of these processes, a conventional OPC pattern simulation may be performed with improved accuracy, especially in critical areas of the design. It should be noted that one obstacle to successful use of double simulation techniques has been format incompatibility. By using bitmapped images (as further described below) the present scheme overcomes this obstacles.

In one embodiment, the present scheme involves simulating a photolithographic mask for fabrication of an integrated circuit, then simulating an image to be produced by that mask on a wafer. Afterwards, the mask may be corrected and/or optimized. Furthermore, the simulation or image of the mask may be so corrected and/or optimized. Such correction/optimization may be accomplished by increasing or decreasing at least one magnitude or value of an optical proximity correction factor and/or a serif. The formats of the data input to or output from these simulation procedures are compatible with one another (e.g., bitmap format). Further, in other embodiments, corner rounding effects in an image produced by a mask may be corrected through simulation of optical proximity effects of the mask (e.g., effects of light having a wavelength approximately equal to four times a feature size-such as a line width or line spacing of the image). These corrections may be incorporated into the mask by adjusting an as-drawn layout of the mask as part of a CAD process.

Although discussed with reference to certain illustrated embodiments, upon review of this specification, those of ordinary skill in the art will recognize that the present scheme may find application in a variety of systems. For example, other methods of simulating mask rounding and edge correction may be used. Therefore, in the following description the illustrated embodiments should be regarded as exemplary only and should not be deemed to be limiting in scope.

Figure 2A:
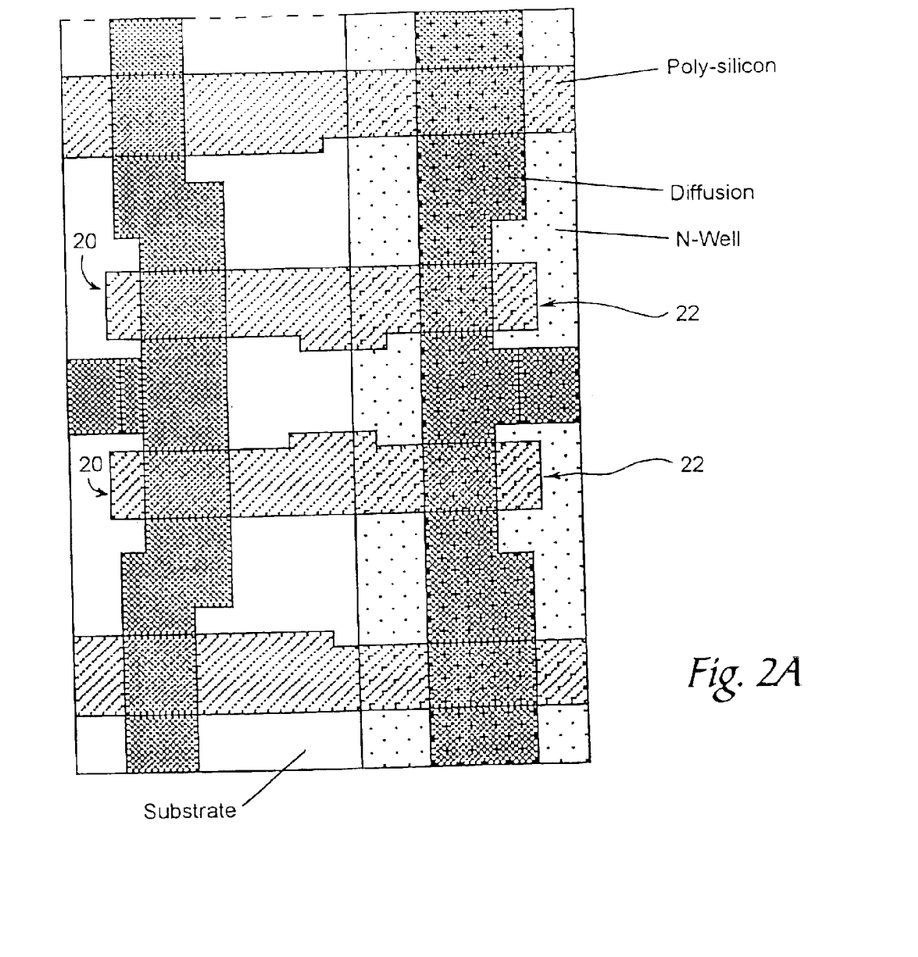
FIGS. 2A and 2B illustrate various layers of double wordline and single wordline static random access memory (SRAM) cells, respectively.
Figure 2B:
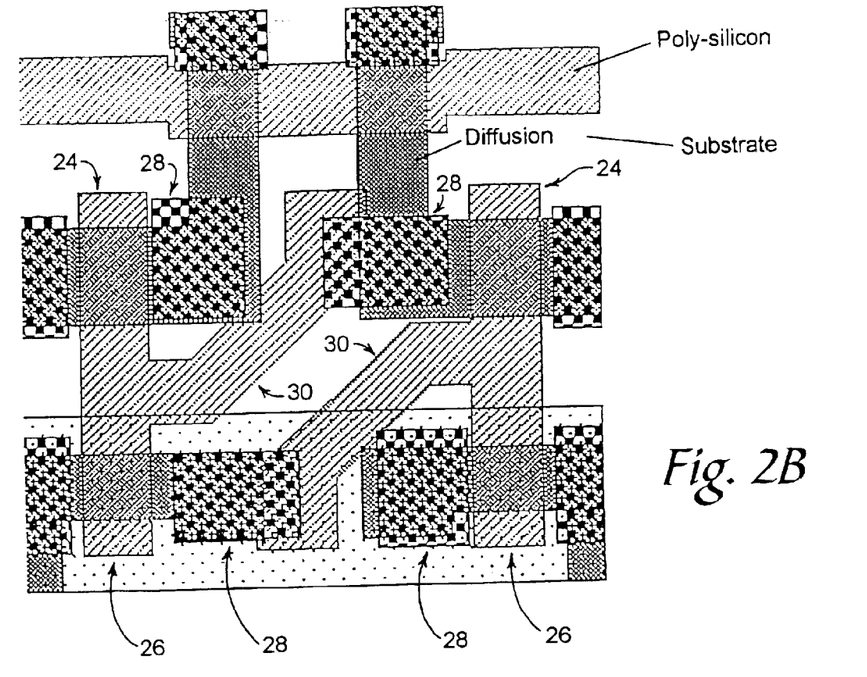

By way of example, the present scheme is discussed with reference to the design of two, six transistor (AT) static random access memory (SRAM) cells: one having a double wordline (DWL) and the other a single wordline (SWL). Those familiar with the design of such devices will appreciate that a key layer in determining cell properties is the poly-silicon layer in which transistor gate features are formed. The DWL cell, the layout of which is shown in FIG. 2A, has a straightforward poly layout, requiring only line-end serifs 20 and 22. The SWL cell, the layout of which is shown in FIG. 2B, may be approximately 30% smaller that the DWL cell, at the expense of higher sensitivity to mask quality and complicated OPC processes. In addition to serif end-caps 24 and 26, the design of contact regions 28 and 45° poly-silicon arms 30 need to be optimized.

These two cell designs present different challenges to manufacturing, which challenges are affected by the reticle writing process. The simplicity of poly layout in the DWL cell makes it necessary to complicate the interconnecting level (not shown in the illustration). On the other hand, the SWL cell is sensitive to the rounding of inside poly corners, the 45° poly arms and line-end-to-line proximity. Thus, for the DWL cell, the key concern at poly level is to maximize end-cap coverage by adjusting serifs 20 and 22, butting up against each other. For the SWL cell, in addition to end-caps 24 and 26, the inside poly corners arms are modified by "negative" serifs to reduce the line width and leave more room for contacts 28. The 45° connecting poly arms should also be minimized, to reduce proximity effects on the contact and channel areas.

It has been found that layout optimization for these and other designs can be significantly improved by using a double-level simulation scheme. This scheme is based on first simulating the reticle, followed by simulating the final photoresist pattern on wafer. The simulation of the reticle pattern itself is a step that has not been performed in OPC processes of the past. To implement the present scheme, a two-level simulation tree may be used, with a first level input file obtained from the final design (nominal layout plus OPC), to generate a reticle bitmap. A second level input file may be obtained from the drawn design, a simulated mask bitmap, or a bitmap of the actual reticle extracted from a scanning electron microscope (SEM) image. One may then compare intensity contour aerial images of the photoresist pattern simulated in these three ways, with the final pattern on wafer.

Figure 3:
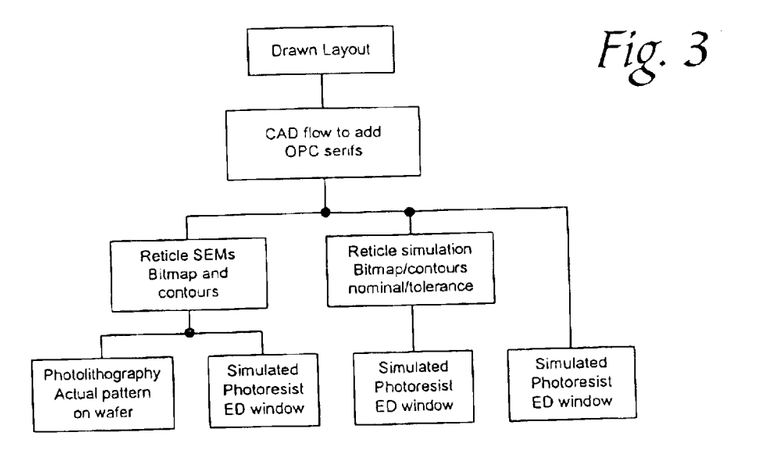
FIG. 3 schematically illustrates an example of the present simulation scheme.

The above-mentioned simulation tree is schematically illustrated in FIG. 3. Beginning with an as-drawn layout, one may use conventional computer aided design (CAD) methods to add OPC serifs thereto. Then, reticle SEMs of the design may be obtained in the conventional fashion. In parallel with this process, simulations of the reticles may be made in accordance with the present methods. These reticle simulations can then be compared with the SEMs to determine the degree of difference. In one example, simulations were made using commercially available Prolith software and the source of inputs to the first round of simulation are shown in FIGS. 4A–4B, 5A–5B and 8A–8D.

Figure 4A:
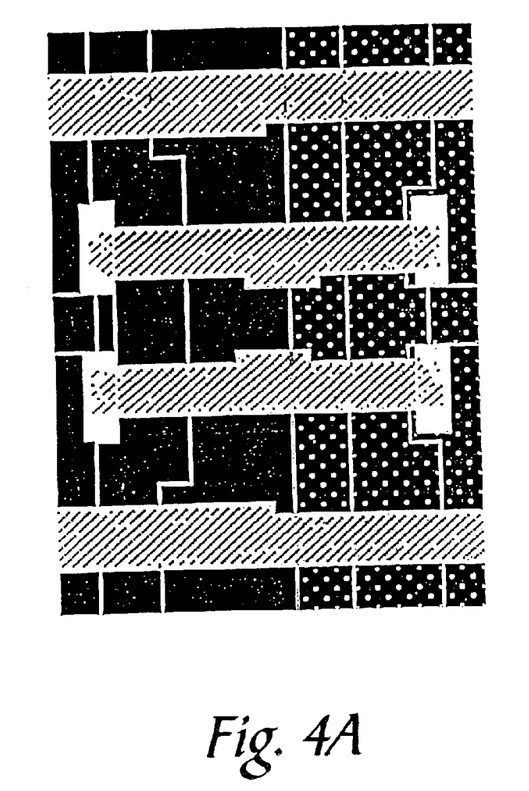
FIGS. 4A and 4B illustrate a final as-drawn layout for a poly-silicon layer of a double wordline SRAM cell and a scanning electron microscope (SEM) picture of a poly-silicon mask obtained therefrom in accordance with an embodiment of the present invention, respectively.
Figure 4B:
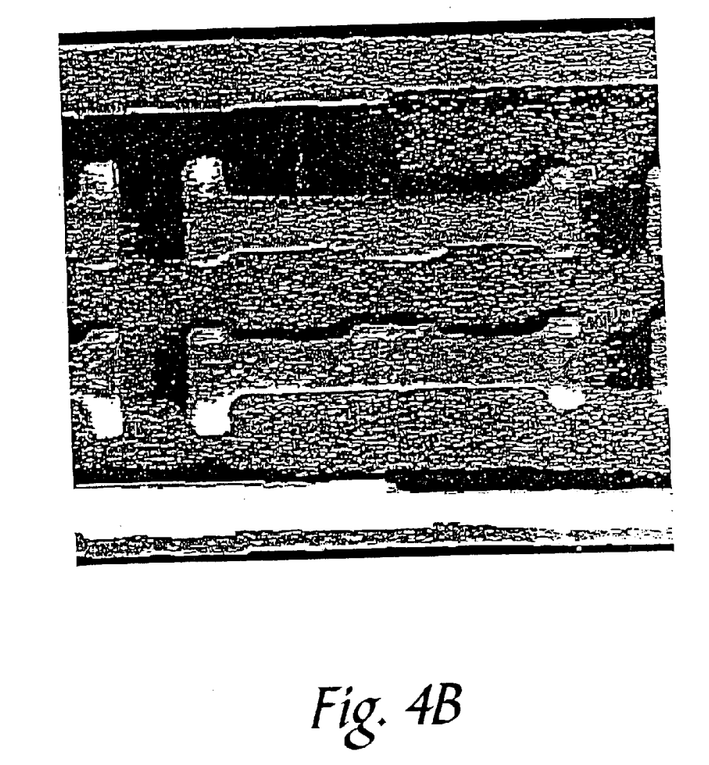
Figure 5A:
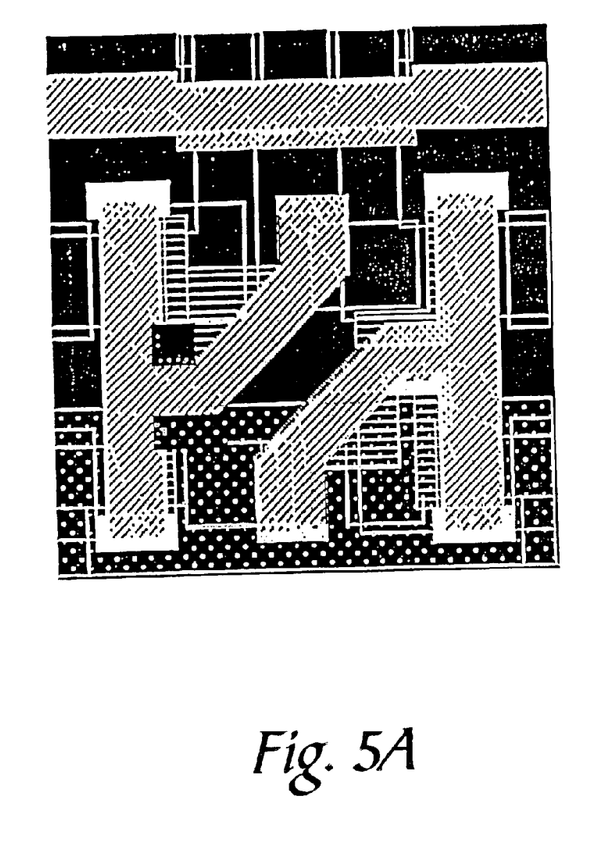
FIGS. 5A and 5B illustrate a final as dawn layout for a poly-silicon layer of a single wordline SRAM cell and a scanning electron microscope (SEM) picture of a poly-silicon mask obtained therefrom in accordance with an embodiment of the present invention, respectively.
Figure 5B:
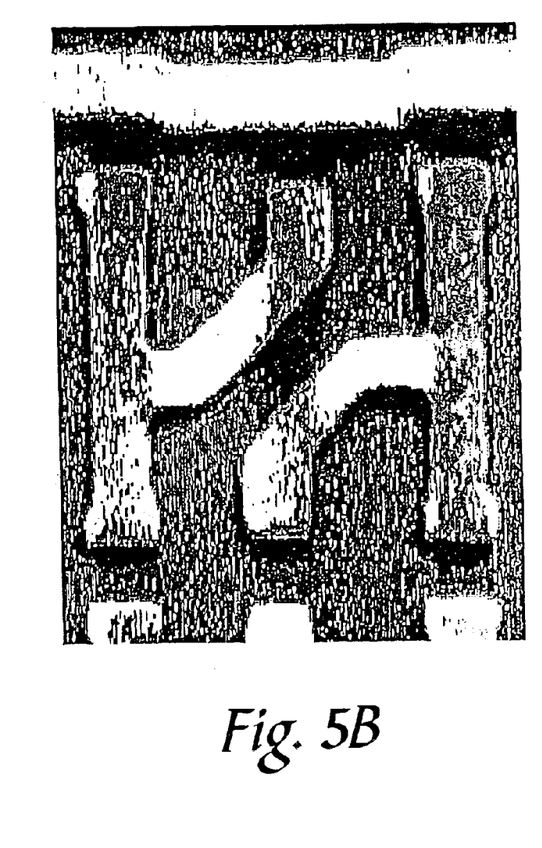

FIGS. 4A and 5A show examples of poly layouts with serifs, added by conventional CAD routines, to the DWL and SWL designs shown in FIGS. 2A and 2B, respectively. Serif size may predetermined before the CAD routines are run using conventional single-level simulation. FIGS. 4B and 5B show SEM images of the poly reticle for the two cell designs. Compared to the drawn layouts, one can observe significant roundings of line-ends of the serifs. It is effects such as these that are not accurately captured by existing OPC processes, but which are compensated for through use of the present methods.

In general, the simulations of masks and final patterns may be based on different sets of image tool parameters. Settings for the reticle simulations may initially be quite arbitrary, as the goal is only to round off sharp corners of the drawn layout. In the present example, standard deep ultraviolet (DUV) illumination with an NA of 0.55 was used. The drawn mask design was blown up by approximately 4 times (Oust as in the actual mask making process) to achieve a sufficiently high ratio of radiation wavelength to feature size. Bitmap extraction was based on a 0.28 intensity contour, which was then filled and used in a subsequent simulation of the final pattern. Silicon DUV photolithography using annular illumination at 0.6 NA and 0.75/0.45 outer/inner diameter was used. These conditions were also used to simulate aerial images of the intensity contours. The contour reproducing the nominal MOSFET CD on the wafer corresponded to an intensity level of about 0.3. In addition, another contour, of about 10% higher intensity, was examined to verify the effect of defocus and scumming.

Figure 6A:
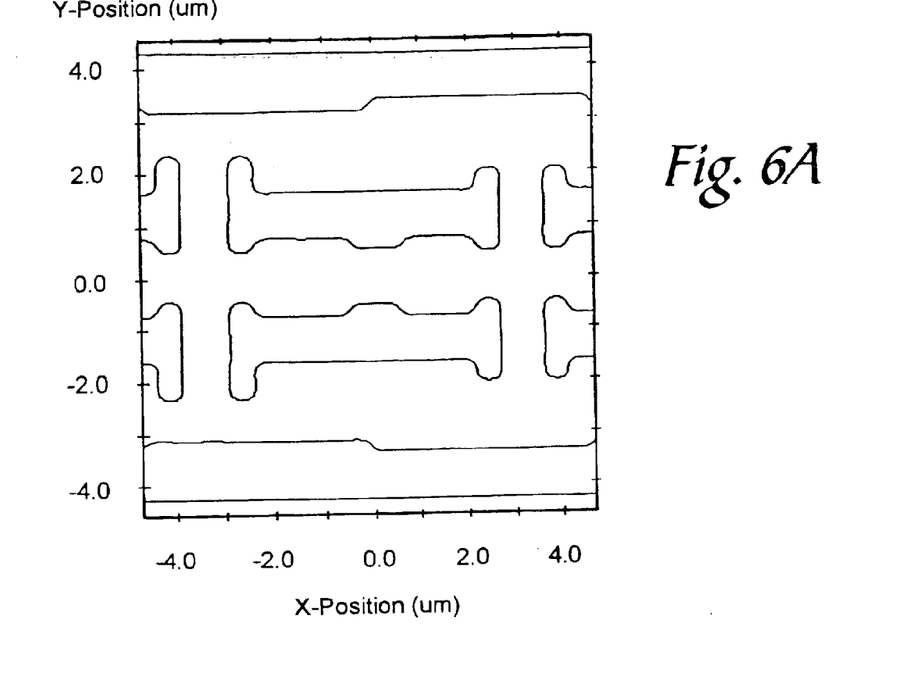
FIGS. 6A and 6B illustrate examples of simulated mask contours produced in accordance with an embodiment of the present invention for a double wordline SRAM cell and a single wordline SRAM cell, respectively.
Figure 6B:
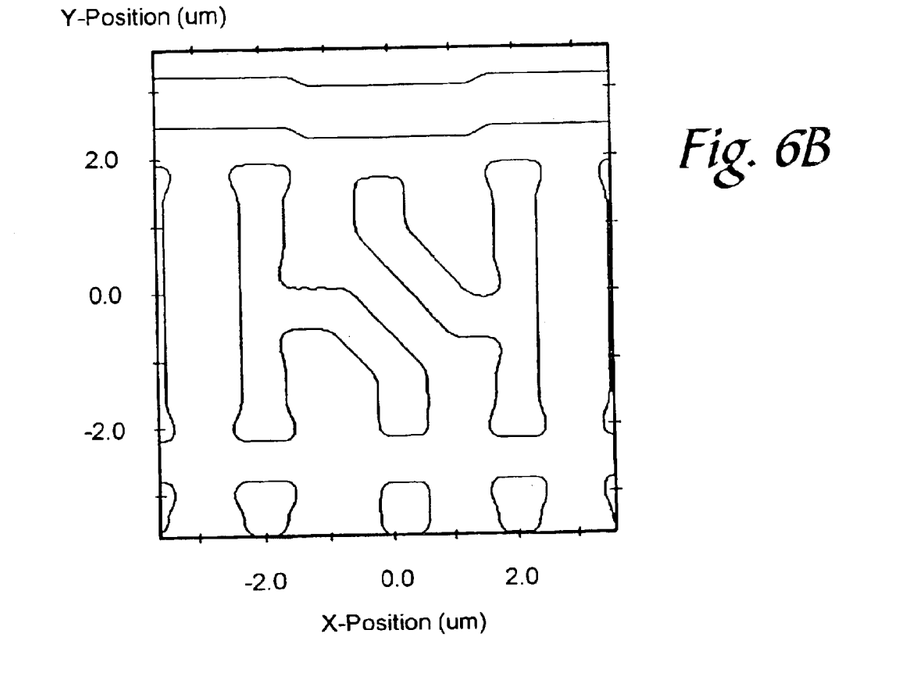

Simulated contours of poly masks for the DWL and SWL designs which are the subject of the above example and which were produced in accordance with the present methods are shown in FIGS. 6A and 6B, respectively. Compared to the SEM images of the reticles (see FIGS. 4B and 5B), the corner rounding of the line-end serifs was simulated with a high degree of accuracy. This corner rounding simulation accuracy now allows for modification to the as-drawn design so as to achieve square line-ends in the final printed pattern.

Figure 7A:
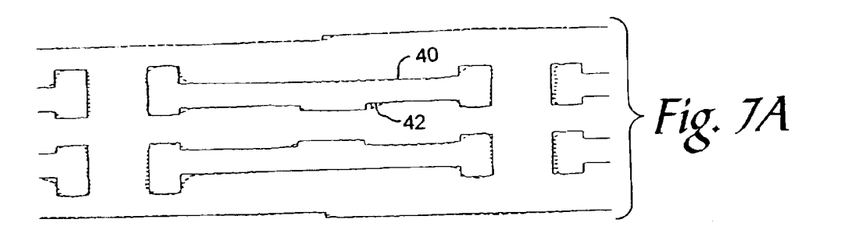
FIGS. 7A and 7B, illustrate, for a double wordline SRAM cell, an overlay of a reticle contour with a contour of an as drawn design, and a contour of a simulated mask, respectively, in accordance with an embodiment of the present invention.
Figure 7B:
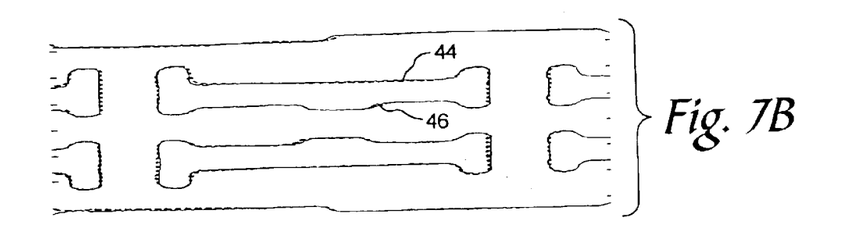
Figure 7C:
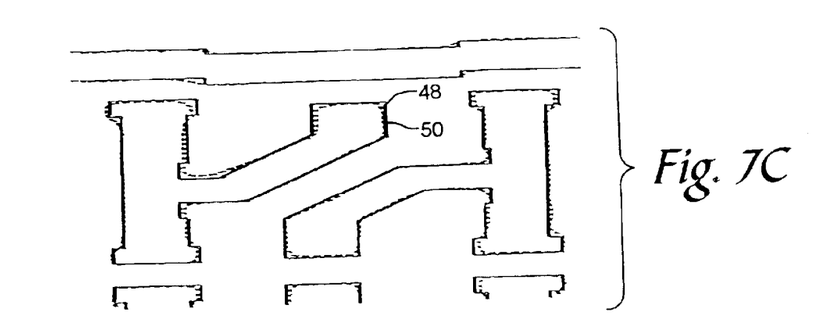
FIGS. 7C and 7D, illustrate, for a single wordline SRAM cell, an overlay of a reticle contour with a contour of an as drawn design, and a contour of a simulated mask, respectively, in accordance with an embodiment of the present invention.
Figure 7D:
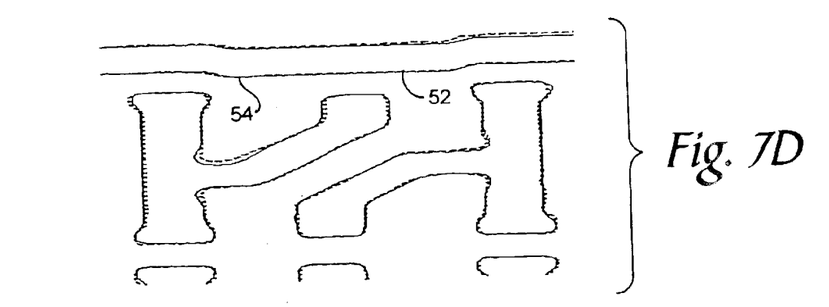

FIGS. 7A–7D show various overlays of drawn, SEM, and simulated contours produced in accordance with the present methods. In FIG. 7A, the dashed contour 40 represents the reticle SEM contour for the DWL cell. Contour 40 has been overlaid on a contour 42 of the drawn design (solid line). In FIG. 7B, the dashed contour 44 is again the reticle SEM contour for the DWL cell, with contour 46 (solid line) representing the contour of the simulated mask for the DWL cell with nominal serifs. In FIG. 7C, the dashed contour 48 represents the reticle SEM contour for the SWL cell. Contour 48 has been overlaid on a contour 50, representing the drawn design (solid line). In FIG. 7D, the dashed contour 52 is again the reticle SEM contour for the SWL cell, with contour 54 (solid line) representing the contour of the simulated mask for the SWL cell with nominal serifs.

Through examination of these overlays in accordance with the present methods, it has been observed that corner rounding of the reticle is on the order of 20 nm away from the drawn data (FIGS. 7A and 7C). This difference is reduced to below approximately 5 nm on the simulated contours (FIGS. 7B and 7D). Similar observations were made for both the SWL and DWL designs. The inside corners of the SWL design tended to simulate with slightly lower accuracy (approximately 10 nm from the actual drawn pattern), but still showing much improvement compared to the overlay of the SEM reticle to the drawn layout.

Figure 8A:
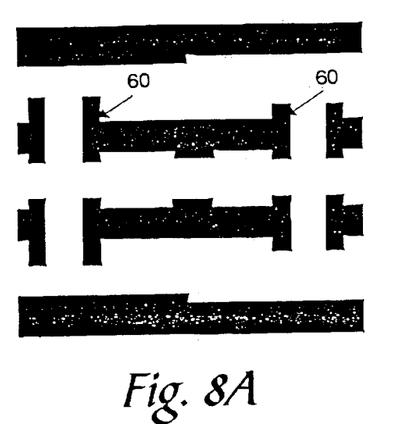
FIGS. 8A and 8B illustrate bitmap inputs to a mask simulation with different sizes of serifs for a double wordline SRAM cell in accordance with an embodiment of the present invention.
Figure 8B:
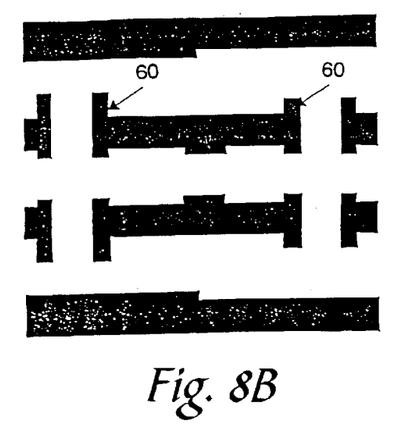
Figure 8C:
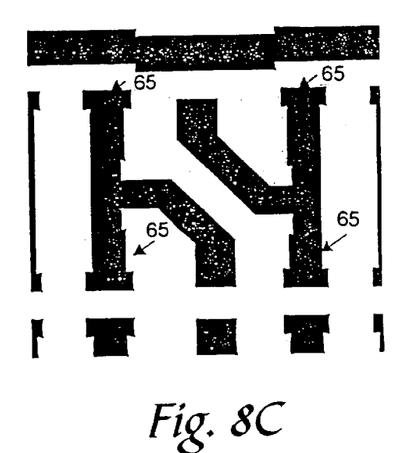
FIGS. 8C and 8D illustrate bitmap inputs to a mask simulation with different sizes of serifs for a single wordline SRAM cell in accordance with an embodiment of the present invention.
Figure 8D:
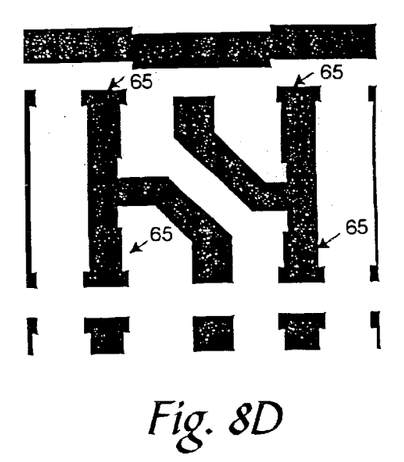

To further verify the usefulness of the mask simulation process described above, the present experiment was continued to examine the effect of serif size variation based on the specified limits of reticle CD. FIGS. 8A and 8B illustrate bitmap inputs to the mask simulation process with different sizes of serifs within tolerances of the reticle specification for the DWL cell. Locations of the modified serifs 60 are indicated by the arrows. FIG. 8A shows the nominal serifs, while FIG. 8B shows the reduced serifs. Similarly, FIGS. 8C and 8D show nominal and reduced serifs 65, respectively, for the SWL cell.

For a nominal MOSFET CD of 0.16 nm, the reticle mean to target CD difference was found to be on the order of 9 nm. However, this variation could be larger on the small serifs and corners. While the consequences of CD variation on MOSFET characteristics are well understood, there is no existing model of MOSFET degradation due to variations of serif size. Consequently, in this experiment optical verification of the distortion of a FET channel due to the anticipated reduction of serif size was explored. Serif length and width were reduced by approximately 10 nm/side on bitmaps used to simulate the photoresist pattern.

Figure 9A:
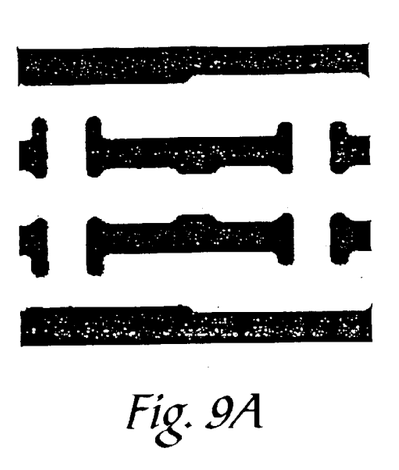
FIGS. 9A and 9B illustrate bitmaps of simulated reticles with nominal serifs compared against bitmaps reconstructed from reticle SEMs for a double wordline SRAM cell in accordance with an embodiment of the present invention.
Figure 9B:
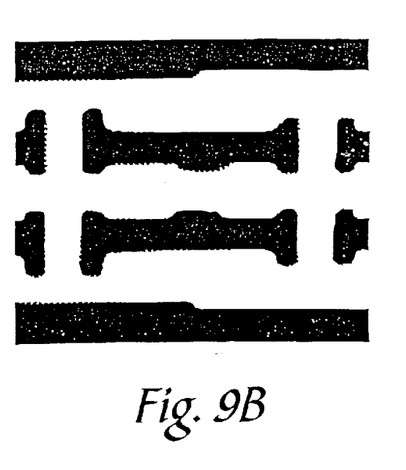
Figure 9C:
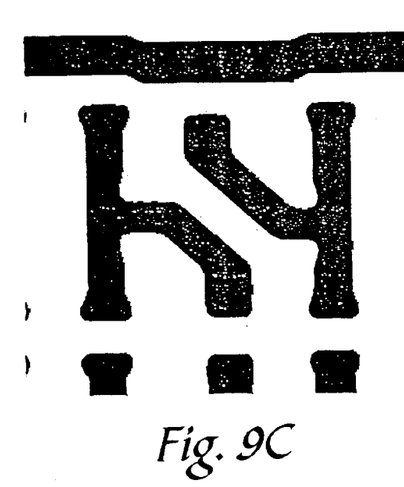
FIGS. 9C and 9D illustrate bitmaps of simulated reticles with nominal serifs compared against bitmaps reconstructed from reticle SEMs for a single wordline SRAM cell in accordance with an embodiment of the present invention.
Figure 9D:
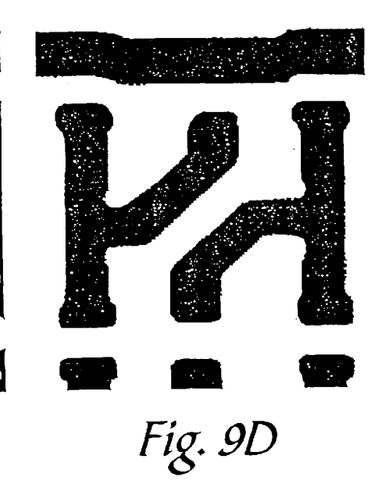
Figure 10A:
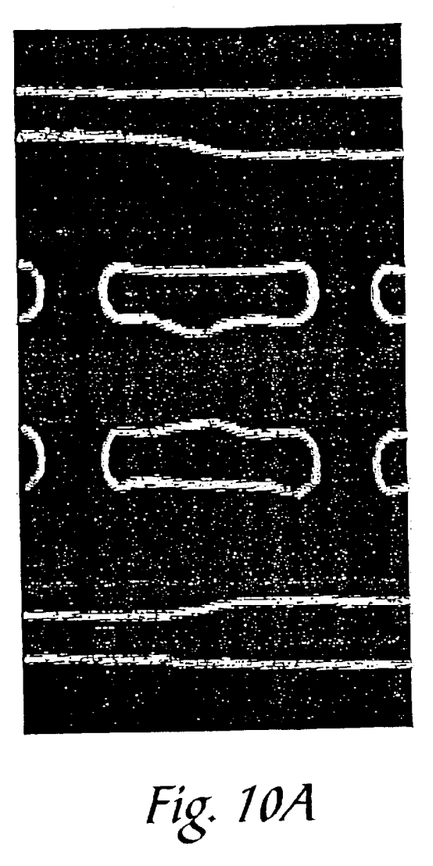
FIGS. 10A and 10B illustrate SEM images of a final poly-silicon pattern on a semiconductor wafer produced in accordance with the present methods for a double wordline SRAM cell and a single wordline SRAM cell, respectively.
Figure 10B:
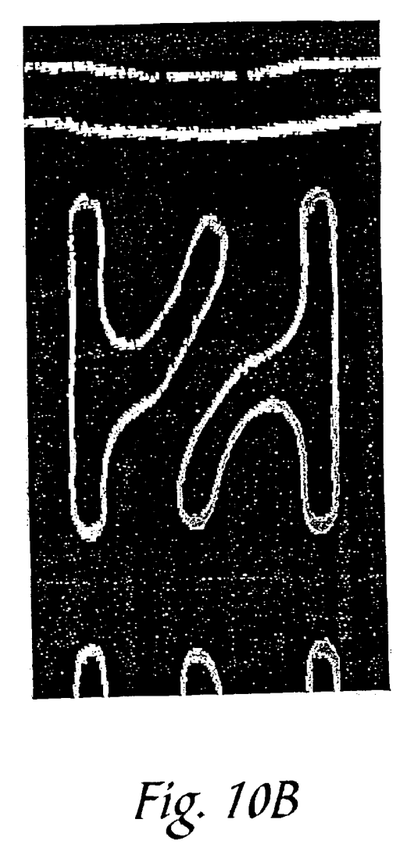

FIGS. 9A–9D show the bitmaps of the simulated reticles with nominal serifs compared against bitmaps reconstructed from reticle SEMs. FIG. 9A shows the simulated reticle for the DWL cell, while the SEM-based bitmap therefor is shown in FIG. 9B. FIG. 9C shows the simulated reticle for the SWL cell, while the SEM-based bitmap therefor is shown in FIG. 9D. Note the close agreement between the bitmaps, as evidenced by the above-noted 9 nm variations. This is much better accuracy of mask pattern to actual printed pattern than has been achieved using single-level simulations. FIGS. 10A and 10B show SEM images of the final poly patterns for the DWL and SWL cells, respectively, printed on the wafers using the masks produced in accordance with the present scheme.

Figure 11A:
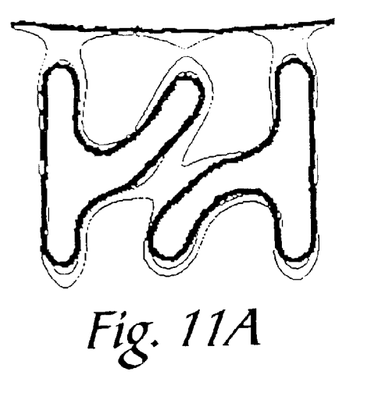
FIGS. 11A–11F illustrate extracted poly-silicon contours of a single wordline SRAM cell overlaid with various countour features in accordance with an embodiment of the present invention.
Figure 11B:
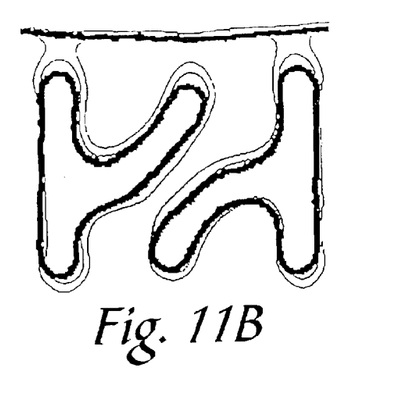
Figure 11C:
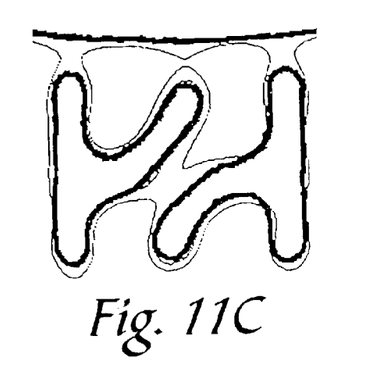
Figure 11D:
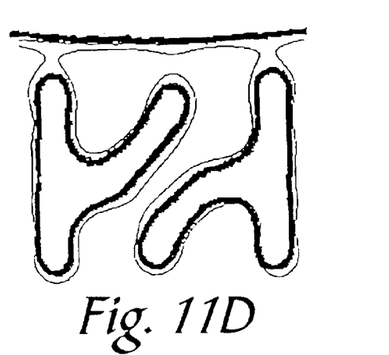
Figure 11E:
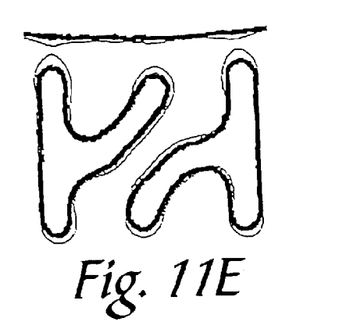
Figure 11F:
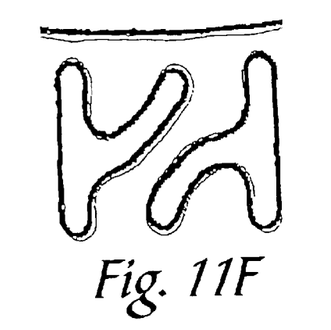

By way of further example, FIGS. 11A–11F illustrate various extracted poly contours of the SWL cell SEMs with simulated contours. In each case, nearly perfect fits were obtained for the simulated reticle. Areas of poor simulation quality are indicated by the arrows. In FIGS. 11A and 11B, the SEM contour (thick line) is overlaid on the drawn design. Notice the number of poor matchings at the corners of the poly features. FIGS. 11C and 11D show the SEM contour (thick line) overlaid on an SEM bitmap of the actual reticle. Again, a poor fit is evident at the corners. However, in FIGS. 11E and 11F, the near perfect fit of the SEM contour (thick line) to the simulated reticle shapes are shown. This tends to indicate that the addition of a mask simulation step in the OPC process, in accordance with the present invention, yields significantly improved masks for IC fabrication.

Simulated photoresist patterns using bitmap images may be also used to verify the quality of a mask writing process and its impact on cell performance. One can expect that reticles written using laser (Alta) and e-beam (Mebes) tools could differ in both CD variation and corner rounding. In addition, using e-beam tools can restrict the size of the database, due to the typically long write times. In order to reduce the address count for the mask writing process and to eliminate off-grid points due to the selective sizing, 45-degree lines can be converted into 90-degree staircases. Illustrations of such cells are presented in FIGS. 12A and 12B.

Figure 12A:
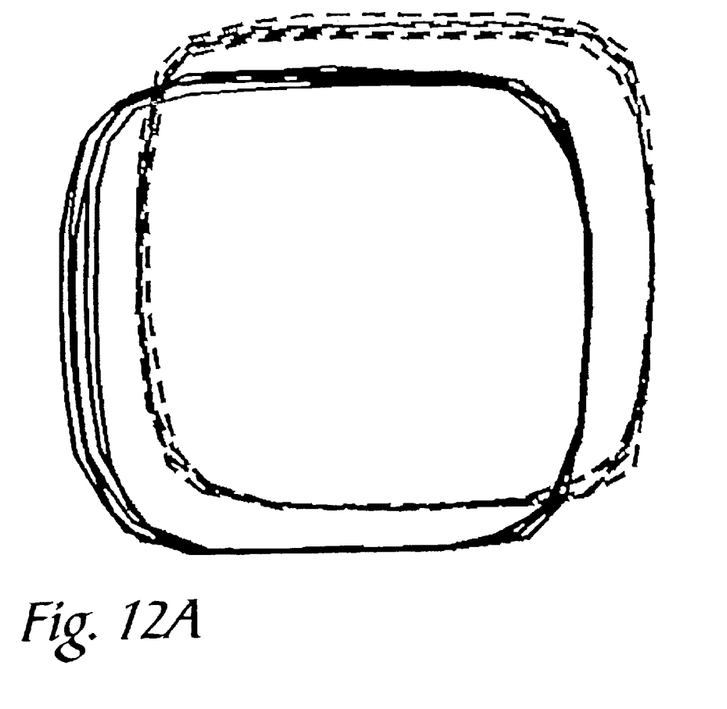
FIGS. 12A and 12B illustrate contours extracted from reticle SEM images for a contact hole and a poly-silicon feature, respectively, in accordance with an embodiment of the present invention.
Figure 12B:
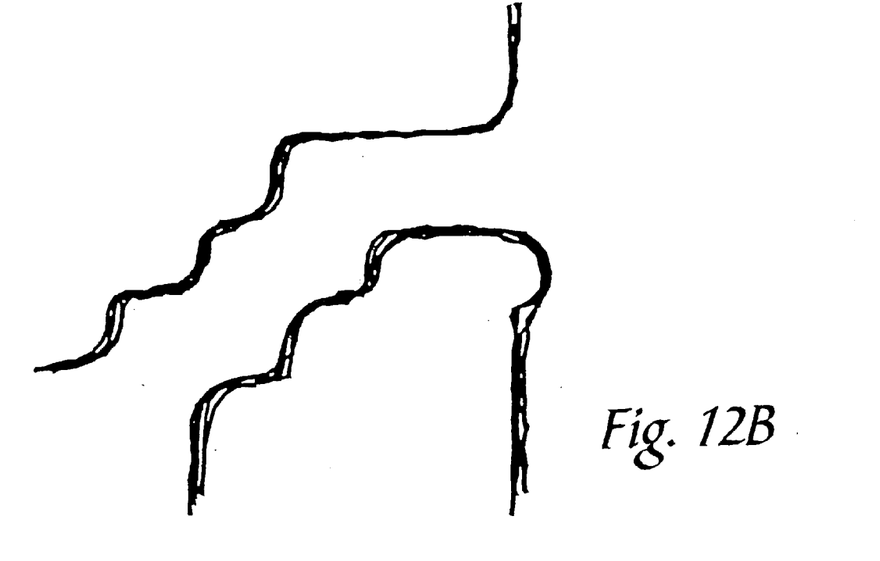

In FIG. 12A, contours extracted from reticle SEM images of a contact hole patterned with e-beam and laser tools are shown. In FIG. 12B, a 45° poly connector patterned using a single pass Mebes tool is illustrated. In each case, note the close agreement between the SEM images and the simulations.

Figure 13A:
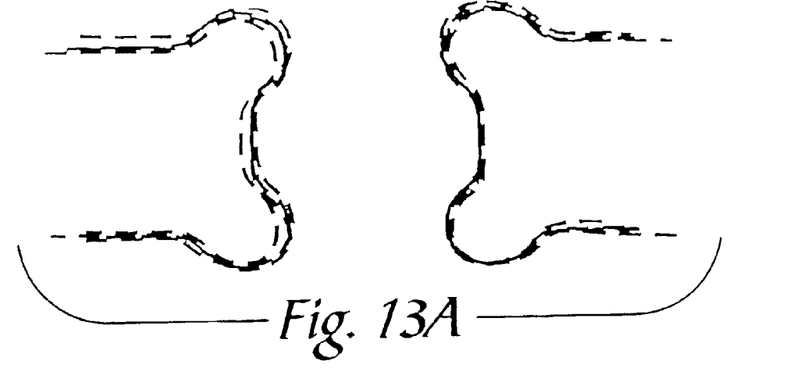
FIGS. 13A–13C illustrate diffusing contours for a double wordline SRAM cell extracted from reticle SEM images in accordance with an embodiment of the present invention.
Figure 13B:
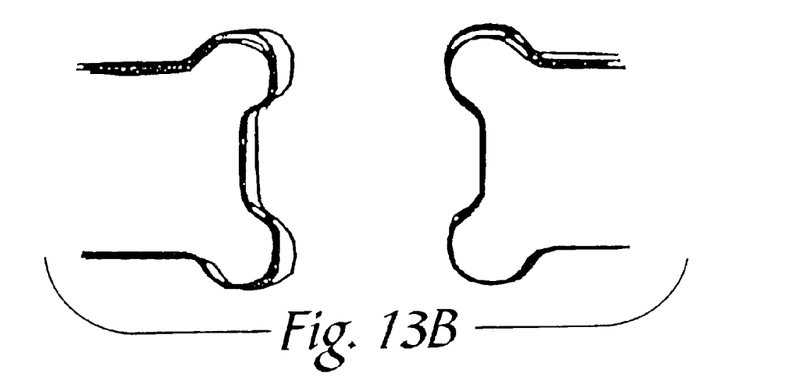
Figure 13C:
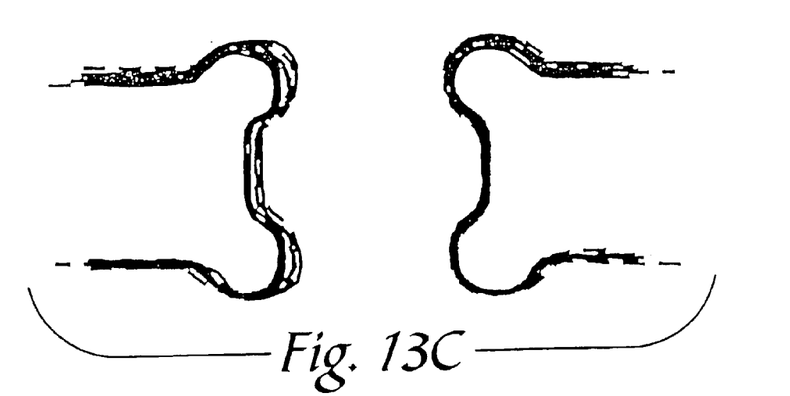

Finally, in FIGS. 13A–13C, contours extracted from a DWL cell diffusion area are shown. In FIG. 13A, the DWL diffusion contour extracted from SEM images patterned with a Mebes tool is shown. In FIG. 13B the DWL diffusion contour extracted from SEM images patterned with an Alta tool is shown. In FIG. 13C, an overlay is presented.

Thus a scheme for reducing or eliminating misalignment problems in a dual damascene metalization process has been described. Although the foregoing description and accompanying figures discuss and illustrate specific embodiments, it should be appreciated that the present invention is to be measured only in terms of the claims that follow.

What is claimed is:

1. A method for producing a mask for fabrication of an integrated circuit, comprising:

simulating a mask from a first drawn layout, to produce a simulated mask;

comparing the simulated mask and the first drawn layout;

correcting the first drawn layout, to produce a second drawn layout; and producing a mask from the second drawn layout;

wherein the simulating comprises simulating proximity effects and resolution due to spot size.

2. The method of claim 1, further comprising correcting and/or optimizing the mask.

3. The method of claim 2 wherein said correcting and/or optimizing comprises increasing or decreasing at least one magnitude or value of (a) an optical proximity correction factor and/or (b) a serif.

4. The method of claim 1, wherein the proximity effects comprise effects of light having a wavelength of approximately four times a feature size of said drawn layout.

5. The method of claim 1, further comprising simulating a photoresist pattern from the simulated mask, prior to correcting the first drawn layout.

6. A method of producing a semiconductor structure, comprising:

producing a mask by the method of claim 1; and producing a semiconductor structure from the mask.

7. A method of producing an integrated circuit, comprising:

producing a semiconductor structure by the method of claim 6; and producing a integrated circuit from the semiconductor structure.

8. The method of claim 5, further comprising correcting and/or optimizing the simulation of the photoresist pattern.

9. The method of claim 8, wherein said correcting and/or optimizing comprises increasing or decreasing at least one magnitude or value of (a) an optical proximity correction factor and/or (b) a serif.

10. The method of claim 1, further comprising correcting corner rounding effects in an image produced by the mask.

11. The method of claim 10, wherein correcting corner rounding effects comprises applying distortions to corners and serifs in the mask.

* * * * *

UNITED STATES PATENT AND TRADEMARK OFFICE
CERTIFICATE OF CORRECTION

PATENT NO.        : 6,834,262 B1
APPLICATION NO.   : 09/608158
DATED             : June 30, 2000
INVENTOR(S)       : Artur E. Balasinski et al.

It is certified that error appears in the above-identified patent and that said Letters Patent is hereby corrected as shown below:

Title page under item [56] Col 2

In Other Publications:

In the Balasinski, A et al. article, please delete "pproach" and insert --approach--.

Signed and Sealed this

Thirtieth Day of January, 2007

JON W. DUDAS
*Director of the United States Patent and Trademark Office*

UNITED STATES PATENT AND TRADEMARK OFFICE
CERTIFICATE OF CORRECTION

PATENT NO.         : 6,834,262 B1                              Page 1 of 1
APPLICATION NO.    : 09/608158
DATED              : December 21, 2004
INVENTOR(S)        : Artur E. Balasinski et al.

It is certified that error appears in the above-identified patent and that said Letters Patent is hereby corrected as shown below:

Title page under item [56] Col 2

In Other Publications:

In the Balasinski, A et al. article, please delete "pproach" and insert --approach--.

This certificate supersedes Certificate of Correction issued January 30, 2007.

Signed and Sealed this

Sixth Day of March, 2007

JON W. DUDAS
*Director of the United States Patent and Trademark Office*